United States Patent
Zolfaghari

(10) Patent No.: US 8,406,692 B2
(45) Date of Patent: Mar. 26, 2013

(54) POLAR TRANSMITTER AMPLIFIER WITH VARIABLE OUTPUT POWER

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 284 days.

(21) Appl. No.: 12/880,937

(22) Filed: Sep. 13, 2010

(65) Prior Publication Data

US 2010/0330913 A1    Dec. 30, 2010

Related U.S. Application Data

(62) Division of application No. 11/478,253, filed on Jun. 29, 2006, now Pat. No. 7,817,962.

(51) Int. Cl.
*H04B 7/00* (2006.01)
*H04B 1/04* (2006.01)

(52) U.S. Cl. .................. 455/42; 455/127.3

(58) Field of Classification Search .............. 455/42, 455/552.1, 91, 127.3, 194.2, 253.2, 17, 23, 455/102
See application file for complete search history.

(56) References Cited

U.S. PATENT DOCUMENTS

| | | | | |
|---|---|---|---|---|
| 6,834,084 B2 * | 12/2004 | Hietala | ............ | 375/296 |
| 6,844,788 B2 * | 1/2005 | Chadwick | ............ | 332/159 |
| 6,873,211 B1 * | 3/2005 | Thompson et al. | ............ | 330/285 |
| 6,917,791 B2 * | 7/2005 | Chadwick | ............ | 455/126 |
| 7,257,380 B2 | 8/2007 | Darabi et al. | | |
| 7,539,462 B2 | 5/2009 | Peckham et al. | | |
| 7,565,118 B2 * | 7/2009 | Hara | ............ | 455/108 |
| 7,817,962 B2 | 10/2010 | Zolfaghari | | |
| 7,953,380 B2 * | 5/2011 | Birafane | ............ | 455/127.3 |
| 2006/0068725 A1 | 3/2006 | Zolfaghari | | |
| 2007/0230612 A1 | 10/2007 | Ahmed | | |
| 2007/0247253 A1 | 10/2007 | Carey et al. | | |
| 2007/0291875 A1 | 12/2007 | Lee et al. | | |
| 2007/0298731 A1 | 12/2007 | Zolfaghari | | |

OTHER PUBLICATIONS

Notice of Allowance received for U.S. Appl. No. 11/478,253, mailed on Jun. 17, 2010, 4 pages.
Office Action received for U.S. Appl. No. 11/478,253, mailed on Apr. 8, 2009, 8 pages.
Office Action Response filed for U.S. Appl. No. 11/478,253, filed on Sep. 8, 2009, 5 pages.
Office Action received for U.S. Appl. No. 11/478,253, mailed on Dec. 10, 2009, 7 pages.
Office Action Response filed for U.S. Appl. No. 11/478,253, filed on Apr. 12, 2010, 6 pages.
Amendment under 37 CFR 1.312 filed after Notice of Allowance for U.S. Appl. No. 11/478,253, filed on Sep. 13, 2010, 5 pages.

* cited by examiner

*Primary Examiner* — Sonny Trinh
(74) *Attorney, Agent, or Firm* — Brake Hughes Bellermann LLP

(57) ABSTRACT

Various embodiments are disclosed relating to wireless systems, and also relating to transmitter amplifiers, such as, for example, polar transmitter amplifiers with variable output power. According to an example embodiment, a circuit is provided including a plurality of selectable amplifier cells. Each amplifier cell may receive a phase or frequency modulated signal and an amplitude modulated signal. Each amplifier cell may output a signal based upon a combination of the received amplitude modulated signal and the received phase or frequency modulated signal if the amplifier cell is selected. The circuit may provide a variable output current or output power based upon the selection of one or more of the amplifier cells.

26 Claims, 5 Drawing Sheets

POLAR TRANSMITTER AMPLIFIER WITH VARIABLE OUTPUT POWER

CROSS-REFERENCE TO RELATED APPLICATIONS

This application is a divisional of and claims priority to U.S. patent application Ser. No. 11/478,253, filed on Jun. 29, 2006 and titled "Polar Transmitter Amplifier With Variable Output Power," the entire contents of which are herein incorporated by reference.

BACKGROUND

Wireless transceivers are used in a wide variety of wireless systems. A wireless transceiver may typically include a wireless receiver for receiving and demodulating signals, and a transmitter for modulating signals for transmission. Wireless devices typically include a power amplifier coupled to the transceiver to amplify and transmit signals. Some wireless systems may also provide operation for multiple frequency bands. However, many circuits used for wireless devices are tuned or operable specifically for one band, or separate duplicate circuits may typically be used for multi-band systems. In some cases, this may require multiple circuits, e.g., one circuit for each band in the case of a multi-band transceiver, which can increase the size and cost of the circuits. In addition, in some cases power or current output from some circuits is often fixed or inflexible.

SUMMARY

Various embodiments are disclosed relating to wireless systems, and also relating to a polar transmitter amplifier with variable output power.

According to an example embodiment, an apparatus may be provided. The apparatus may include a multiplexer to receive a plurality of phase or frequency modulated signals. Each phase or frequency modulated signal may be provided on a different frequency band. The multiplexer may select and output one of the received phase or frequency modulated signals. The apparatus may also include a multi-band driver circuit to receive the selected phase or frequency modulated signal and an amplitude modulated signal. The multi-band driver circuit may output a signal that combines the amplitude modulated signal and the selected phase or frequency modulated signal.

The apparatus may include one or more additional features, in one or more alternative embodiments. For example, the apparatus may include a plurality of power amplifiers. Each of the power amplifiers may operate in one of the frequency bands and may be coupled to one of the outputs of the multi-band driver circuit. In an example embodiment, the multi-band driver circuit may include a plurality of selectable amplifier cells to provide a variable output current based upon the selection of one or more of the amplifier cells.

In another example embodiment, each amplifier cell may output a current that may be based upon a combination of the received amplitude modulated signal and the selected phase or frequency modulated signal. In addition, in another example embodiment, each of the amplifier cells may include a first cascode pair of transistors coupled to a positive output of the amplifier cell, a second cascode pair of transistors coupled to a negative output of the amplifier cell, and a cascode current source.

In addition, the multi-band driver circuit may further include, in another example embodiment, a power control circuit to receive a digital power control signal and to output one or more bias voltages to selectively enable one or more of the amplifier cells to vary or select an output current or output power of the multi-band driver circuit based on the digital power control signal.

In another embodiment, an apparatus may be provided. The apparatus may include a plurality of selectable amplifier cells. Each amplifier cell may receive a phase or frequency modulated signal and an amplitude modulated signal. Each amplifier cell may output a signal based upon a combination of the received amplitude modulated signal and the received phase or frequency modulated signal if the amplifier cell is selected, wherein the apparatus may provide a variable output current based upon the selection of one or more of the amplifier cells. In an alternative embodiment, each amplifier cell may include a first cascode pair of transistors coupled to a positive output of the amplifier cell, a second cascode pair of transistors coupled to a negative output of the amplifier cell, and a cascode current source.

According to another embodiment, a method may be provided. The method may include receiving a phase or frequency modulated signal and an amplitude modulated signal at each of a plurality of selectable amplifier cells. The method may also include outputting, from each amplifier cell when selected or enabled, a signal based upon a combination of the received amplitude modulated signal and the received phase or frequency modulated signal, and varying an output current or power by selecting or enabling one or more of the amplifier cells. In an example embodiment, the varying operation may include receiving a power control signal and selectively enabling one or more of the amplifier cells to vary an overall output power or output current based upon the received power control signal.

DETAILED DESCRIPTION

Figure 1:
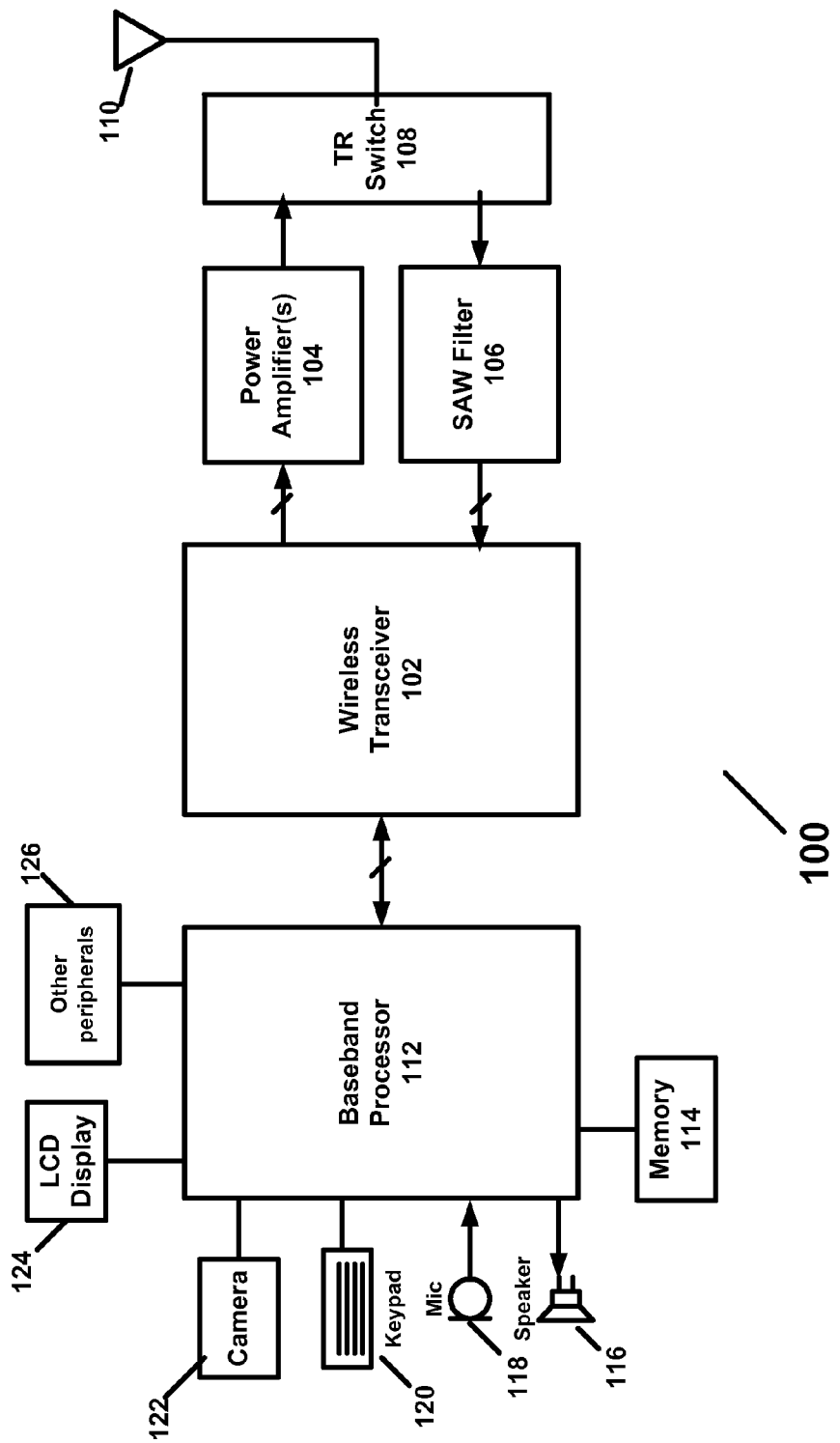
FIG. 1 is a block diagram of a wireless system according to an example embodiment.

FIG. 1 is a block diagram of a wireless system according to an example embodiment. Wireless system 100 may include a wireless transceiver (transmitter/receiver) 102 for transmitting and receiving radio or wireless signals. A baseband processor 112 is coupled to wireless transceiver 110 to perform various types of processing and overall control of system 100, and may perform other tasks. Baseband processor 112 may include a controller, and may include for example, an audio codec to process audio signals, a video or image processing codec (e.g., an MPEG4 compression and/or decompression module), and other components or blocks, not shown.

An antenna 110 may be provided to receive and transmit radio signals or electromagnetic signals. A transmitter/receiver (TR) switch 108 may select either the transmit or receive mode for the antenna 110. Signals output by wireless transceiver 102 to be transmitted may be amplified by amplifier 104 and then transmitted via antenna 110. Signals at radio frequency (RF) (which may be a wireless transmission frequency, not limited to a specific range of frequencies) may be received via antenna 110 may, for example. The received RF signals may be filtered by a SAW (surface acoustic wave) filter 106 (or other filter) and then input to transceiver 102.

At transceiver 102, the received signals may be processed or demodulated, which may include down-converting the signals to an intermediate frequency (IF) and then down-converting to baseband or other frequency, digital detection of data and other signal processing. Likewise, digital data to be transmitted may be received by transceiver 102 from baseband processor 112. Wireless transceiver 110 may modulate the digital data from baseband processor 112 onto a selected channel or frequency (or range or spectrum of frequencies) for transmission over antenna 110.

A variety of blocks or peripherals may be coupled to baseband processor 112. For example, a memory 114, such as a Flash memory or Random Access Memory (RAM), may store information. A microphone 118 and speaker 116 may allow audio signals to be input to and output by wireless system 100, such as for a cell phone or other communications device. A keypad 120 may allow a user to input characters or other information to be processed by wireless system 100. A camera 122 or other optical device may be provided to allow users to capture photos or images that may be processed and/or stored by system 100 in memory or other storage location. Wireless system 100 may also include a display 124, such as a liquid crystal display for example, to display information (text, images, etc.). A variety of other peripherals 126 may be coupled to baseband processor 112, such as a memory stick, an audio player, a Bluetooth wireless transceiver, a USB (Universal Serial Bus) port, or other peripheral. These are merely a few examples of the types of devices or peripherals that may be provided as part of wireless system 100 or coupled to baseband processor 112, and the disclosure is not limited thereto.

Wireless system 100 may be used in a variety of systems or applications, such as a mobile or cellular phone, a wireless local area network (WLAN) phone, a wireless personal digital assistant (PDA), a mobile communications device, or other wireless device. In an example embodiment, wireless system 100 may be capable of operating in a variety of transmit/receive frequencies or frequency bands and for a variety of different standards or communications protocols. Although not required, wireless system 100 may be a multi-band wireless system capable of transmitting or receiving signals on one of a plurality of frequencies or bands. For example, wireless system 100 may operate at or around 1900 MHz for WCDMA (Wide-Band Code Division Multiple Access) or PCS (Personal Communications Services), at or around 1800 MHz for DCS (Distributed Communication Services) (these frequencies may be considered an upper band or high band of frequencies), at 850 MHz for GSM (Global System for Mobile communication), at or around 900 MHz for EGSM (Extended GSM) (these frequencies may be considered a lower band or low band of frequencies). These are merely some example frequencies, and the system 100 may operate at many other frequencies and standards.

The term RF (also known as radio frequency) may refer to any transmitted wireless signal frequency range, and is not limited to a specific frequency band or range. Rather, RF signals may be signals received at the 1.9 GHz range, 1.8 GHz range, 850 MHz range, 900 MHz range, or other wireless transmission frequency ranges, etc. The term IF (or intermediate frequency) may refer to a frequency range, which may be variable, and that is typically lower than RF. Circuits within a wireless receiver typically down-convert or translate received signals from an RF frequency to an IF frequency to perform some types of processing in some cases. In some cases, an IF frequency range may include frequencies relatively close to zero Hz (as compared to RF), such as 1 KHz, 20 KHz, 100 KHz, 200 KHz, 500 KHz, 900 KHz, etc., or other appropriate IF frequency.

Figure 2:
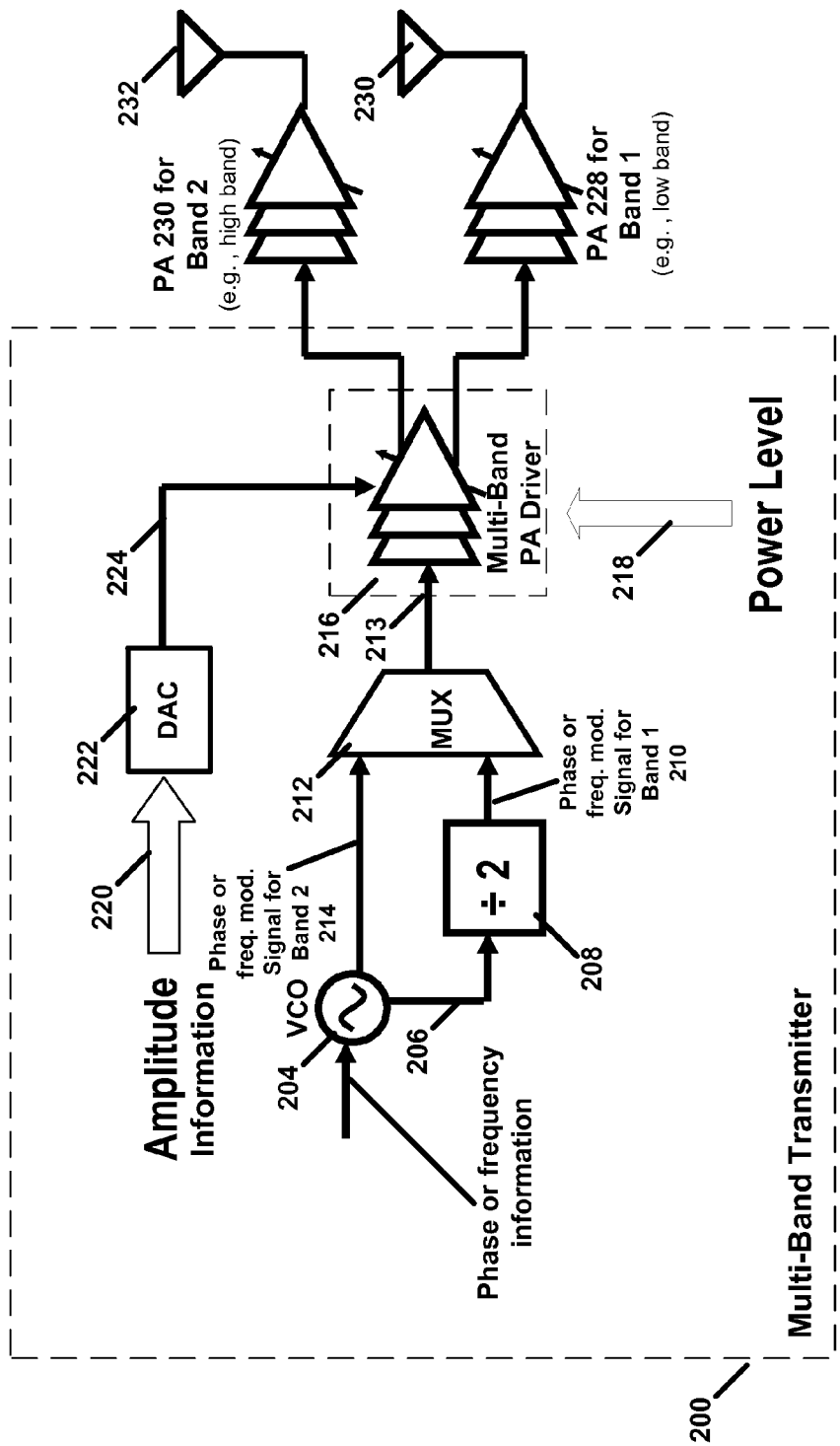
FIG. 2 is a block diagram of a multi-band wireless transmitter according to an example embodiment.

FIG. 2 is a block diagram of a multi-band wireless transmitter 200 according to an example embodiment. Multi-band transmitter 200 may be included within wireless transceiver 102, for example. Wireless transceiver 102 may also include a wireless receiver, not shown. According to an example embodiment, multi-band transmitter 200 may include a number of blocks or circuits, some of which are shown in FIG. 2.

In an example embodiment, multi-band transmitter 200 may include a multi-band power amplifier (PA) driver 216. Multi-band PA driver 216 may, for example, output signals to or drive multiple power amplifiers (PAs), such as to PAs 228 and 230. While only two power amplifiers (PAs) are shown in FIG. 2, PA driver 216 may output signals to or drive any number of PAs. Power amplifiers are also shown generally as power amplifier(s) 140 in FIG. 1.

In an example embodiment, power amplifier (PA) 228 may be coupled to a first output of PA driver 216 to receive and amplify signals associated with a first frequency band or band 1, such as a low band (e.g., 850 and 900 MHz), for example. Similarly, a PA 230 may be coupled to a second output of PA driver 216 to receive and amplify signals for (or associated with) a second frequency band or band 2, such as a high band (e.g., 1850 and 1900 MHz). An antenna 230 is coupled to an output of PA 228, and an antenna 232 is coupled to an output of PA 230. According to an example embodiment, by using one multi-band PA driver to drive multiple power amplifiers (e.g., fewer PA drivers than PAs), a wireless transmitter may, in some cases, be provided that may have a lower cost and/or require less circuitry or silicon space.

Although not required, according to an example embodiment, PA driver 216 may receive a differential input (e.g., positive and negative signals), and may output a signal as a single-ended output to either PA 228 (e.g., when operating in band 1 or low band), and/or to PA 230 (e.g., when operating in band 2 or high band). Therefore, according to an example embodiment and as described in greater detail below, multi-band PA driver 216, in an example embodiment, may provide a conversion from a differential input signal to a single-ended output.

A number of other blocks for multi-band transmitter 200 in FIG. 2 will now be briefly described. A voltage controlled oscillator (VCO) 204 controlled by a phase-locked-loop (PLL) may generate a phase or frequency modulated signal as a VCO output onto lines 214 and 206. Multi-band transmitter 200, may, for example, transmit on one of a plurality of frequency bands, such as either on band 1 (e.g., low band) or band 2 (e.g., high band)), depending on which band the wireless transmitter is operating.

VCO 204 may output a phase and/or frequency modulated signal onto lines 214 and 206. To obtain the lower RF frequency for low band or band 1, the modulated signal output by VCO 204 may, for example, be frequency divided by frequency divider 208 to provide the phase or frequency modulated signal for band 1 (e.g., low band) onto line 210. Multiplexer (or mux) 212 may select one of its inputs for output onto line 213. For example, mux 210 may select the modulated signal received via line 214 when operating for band 2 (e.g., when operating in high band), and may select the signal received via line 210 for band 1 (e.g., when operating in low band), for example.

According to an example embodiment, multi-band PA driver 216 may adjust or vary the power of an output signal based upon a power control (or power level) signal received via line 218.

In an example embodiment, in GSM mode or other types of operating modes, multi-band transmitter 200 may transmit a phase or frequency modulated signal, such as a GMSK modulated signal. In such a GSM mode, the amplitude of the output signal may be constant or substantially constant. However, in other modes of operation, such as EDGE, which may use 8PSK modulation for example, the output signal may be both phase and amplitude modulated. Therefore, amplitude information may be received via line 220 and converted from digital to analog by digital-to-analog converter (DAC) 222 to output an analog amplitude signal onto line 224, which may be an amplitude modulated signal. In EDGE mode or other mode that may use amplitude modulation, multi-band PA driver 216 may receive a phase (or frequency) modulated signal via line 213. PA driver 216 may amplitude modulate the phase modulated signal received via line 213 based on the amplitude signal received via line 224 to output a phase and amplitude modulated signal, for example. In an example embodiment, although not required, the phase or frequency modulated signal received via line 213 may be received at PA driver 216 as a differential signal, while the outputs from PA driver 216 may each be provided as single-ended outputs to PA 228 and PA 230.

Figure 3:
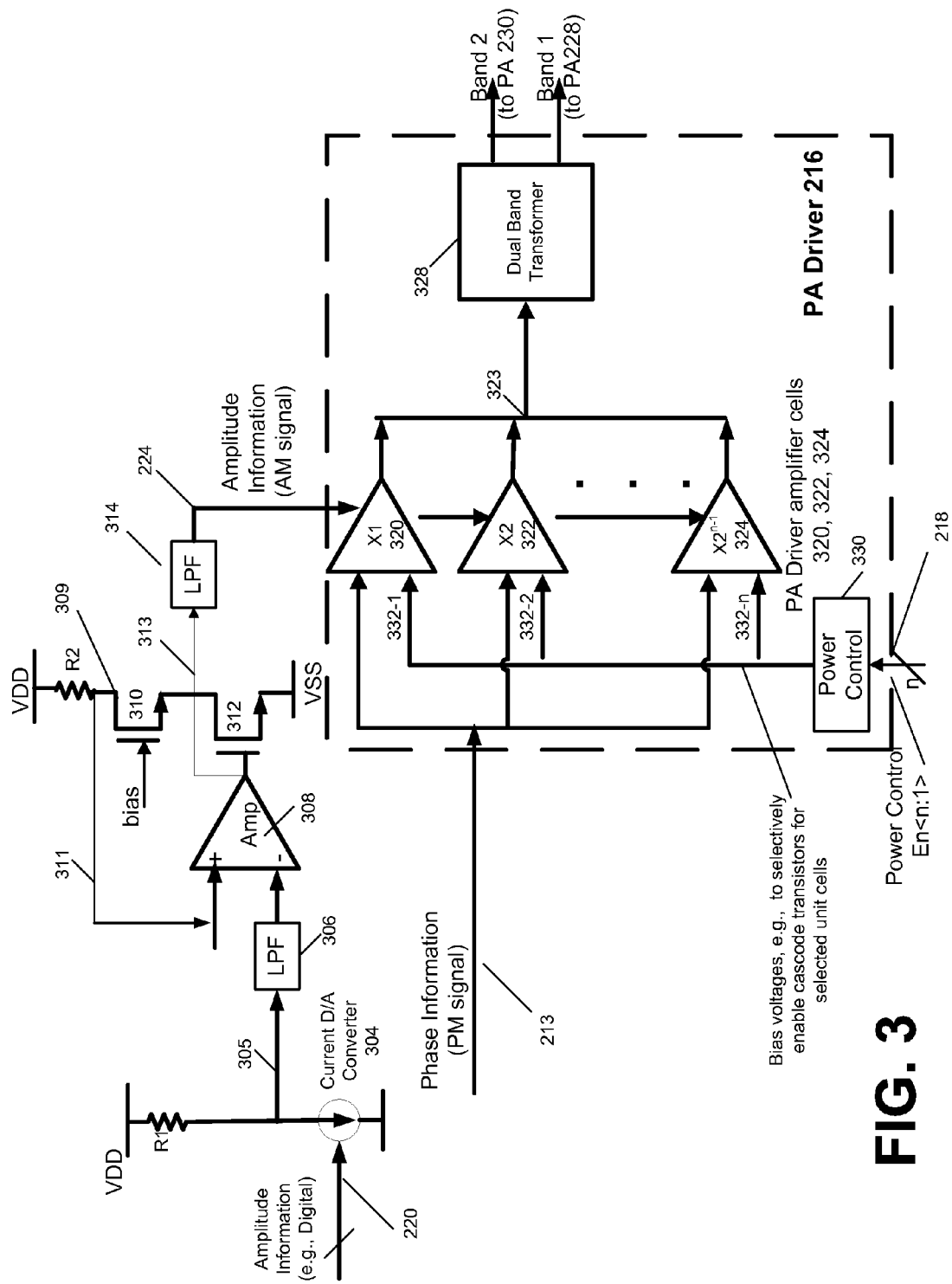
FIG. 3 is a diagram illustrating a multi-band PA driver according to an example embodiment.

FIG. 3 is a diagram illustrating a multi-band PA driver according to an example embodiment. Additional circuitry is also shown in FIG. 3. Digital amplitude information received via line 220 may be converted to an analog amplitude modulated signal using a variety of different techniques. For example, digital analog information may be input to a current D/A (digital-to-analog) converter 304. Current D/A converter 304 provides an analog current based on the received digital amplitude signal. A resistor R1 is coupled between current D/A converter and a voltage VDD. The current provided by current D/A converter 304 causes a current to flow through resistor R1, causing a voltage drop across R1. This results in a voltage being provided on line 305, which is input to low pas filter (LPF) 306.

An output from LPF 306 is coupled to a negative input of an op amp 308. Transistors 310 and 312 are coupled in series between voltage VDD (e.g., between 1.5V and 3.0V for example), and a voltage VSS, which may be a lower voltage, such as ground. A bias voltage may be input to a gate of transistor 310. A resistor R2 is coupled in series between VDD and transistor 310. A current flowing through resistor R2 causes a voltage drop across R2, and a voltage to be provided at point 309, which is provided via feedback loop 311 (or feedback path) to a positive input of op amp 308. An output between transistors 310 and 312 is provided via line 313 to LPF 314. An (analog) amplitude modulated signal is output from LPF 314 via line 214 to PA driver 216.

Op amp 308 may, for example, adjust the voltage input to the gate of transistor 312 such that the voltage drop across resistor R2 is approximately the same as the voltage across resistor R1 (due to current from current D/A converter 304). Thus, op amp 308 may control an output voltage so as to maintain the voltage on line 309 to be the same or approximately the same as the voltage at point 305, for example.

As shown in FIG. 3, an amplitude modulated signal is input to PA driver 216 via line 224. A phase (or frequency) modulated signal (e.g., output from mux 212, FIG. 2) may be input to PA driver 216 via line 213. In addition, a digital power control (or power level) signal may be input to PA driver 216 via line(s) 218.

According to an example embodiment, PA driver 216 may include a plurality of selectable amplifier cells to provide a variable output current based on the selection of one or more of the amplifier cells. Example amplifier cells may include amplifier cells 320, 322 and 324, although any number of amplifier cells may be provided. Each amplifier cell (e.g., 320, 322, 324) may receive as inputs: 1) the amplitude modulated signal via line 224, and 2) a phase (or frequency) modulated signal via line 213. Each amplifier cell, when selected or enabled, may combine (e.g., mix) the received amplitude modulated signal and phase (or frequency) modulated signal. Thus, each amplifier cell, when selected or enabled, may output a signal based upon a combination of the received amplitude modulated signal and the received phase (or frequency) modulated signal. In an example embodiment, the current of the signal output by each amplifier cell may be based upon (or in some cases proportional to) the received amplitude modulated signal and received phase (or frequency) modulated signal, for example.

The outputs from the amplifier cells may be coupled together at point 323, for example, such that the current or power output from each selected or enabled amplifier cell may be added together. In this manner, by selecting one or more amplifier cells (e.g., one or more of amplifier cells 320, 322, 324, . . . ), the PA driver 216 may output a variable or selectable output current or power, for example.

According to an example embodiment, power control signal may be input via line 218 to a power control circuit 330. For example, the power control signal provided via line 218 may be a digital power control signal including a plurality of enable bits or signals En<i>, where one enable bit may be used to select or selectively enable each amplifier cell. For example, bit En<1> may be a 1 to select or enable amplifier cell 320 (and a 0 to indicate non-selection of amplifier cell 320). Likewise, enable bit En<2> may be used to select amplifier cell 322 for example. Other signal formats may be used for the power control signal. Power control circuit 330 may receive the digital power control signals (e.g., En<i>), and may output one or more bias voltages to selectively enable one or more of the amplifier cells to vary or select an output current or output power of PA driver 216 based on the digital power control signal.

In another example embodiment, the appropriate bias voltages may be generated and output by a power control circuit to enable cascode transistor(s), for example, for one or more selected amplifier cells, e.g., based upon the received digital power control signals. For example, bias voltages may be output by power control circuit 330 via lines 332-1, 332-2 and 332-n to enable or select amplifier cells 320, 322 and 324, respectively.

In an example embodiment, each amplifier cell may provide approximately the same output power or current. In another example embodiment, the amplifier cells may provide different or differing output current or power. For example, amplifier cell 320 may provide X1 current, while amplifier cell 322 may provide X2 current, or twice as much current as amplifier cell 320, and the next amplifier cell (not shown) may provide X4 current or 4 times as much current or power as the first amplifier cell 320, etc. Alternatively, the Kth amplifier cell, Xk, may provide current of K times X1, e.g., using K number of X1 cells in parallel or using devices (transistors) K times as large as those used in X1. In an example embodiment, some of the transistors used for amplifier cell 320 may be size X1. Some of the transistors for the second amplifier cell 322 may be twice as large to provide X2 current or power (or twice as much current as the first amplifier cell 320), for example.

Therefore, in an example embodiment, amplifier cell 320 (X1) may be considered a unit cell. Cell 322 (X2) may include two unit cells in parallel. A next amplifier cell (not shown) may be X4, which may include four unit cells (X1) in parallel, or may use devices four times as large as those in X1, for example. Thus, although not required, according to an example embodiment, the size of the devices (or number of unit cells) used in each successive amplifier cell may increase as a power of 2, e.g., X1, X2, X4, X8, etc.

As noted, the outputs from the plurality of amplifier cells may be coupled together at point 323 such that the current or power from each selected amplifier cell may be added together to provide a variable or selectable current or power, for example. The coupled outputs from the amplifier cells 320, 322, 324 may be input, e.g., as differential inputs, to a dual-band transformer 328 (or to a multi-band transformer more generally). However, transformer 328 may be optional, since the amplifier cells may be coupled to any type of load, for example.

According to an example embodiment, dual-band transformer 328 may include a primary transformer winding and a secondary transformer winding. According to an example embodiment, differential input signals may be received at the primary winding from the outputs of the amplifier cells. Transformer 328 may include a plurality of single-ended outputs coupled to the secondary winding. For example, a single-ended output may be provided for each band, or to drive each PA. For example, a first output may be coupled to PA 230, e.g., for band 2, while a second output may be coupled to PA 328, e.g., for band 1. Therefore, according to an example embodiment, transformer 328 may substantially output a signal associated with a first frequency band or band 1 onto a first output, and may substantially output a signal associated with a second frequency band or band 2 onto a second output, for example. However, a portion of the voltage or power from transformer 328 may be applied to an unselected output of transformer 328, even though such unselected output may not be transmitting signals, for example.

Figure 4:
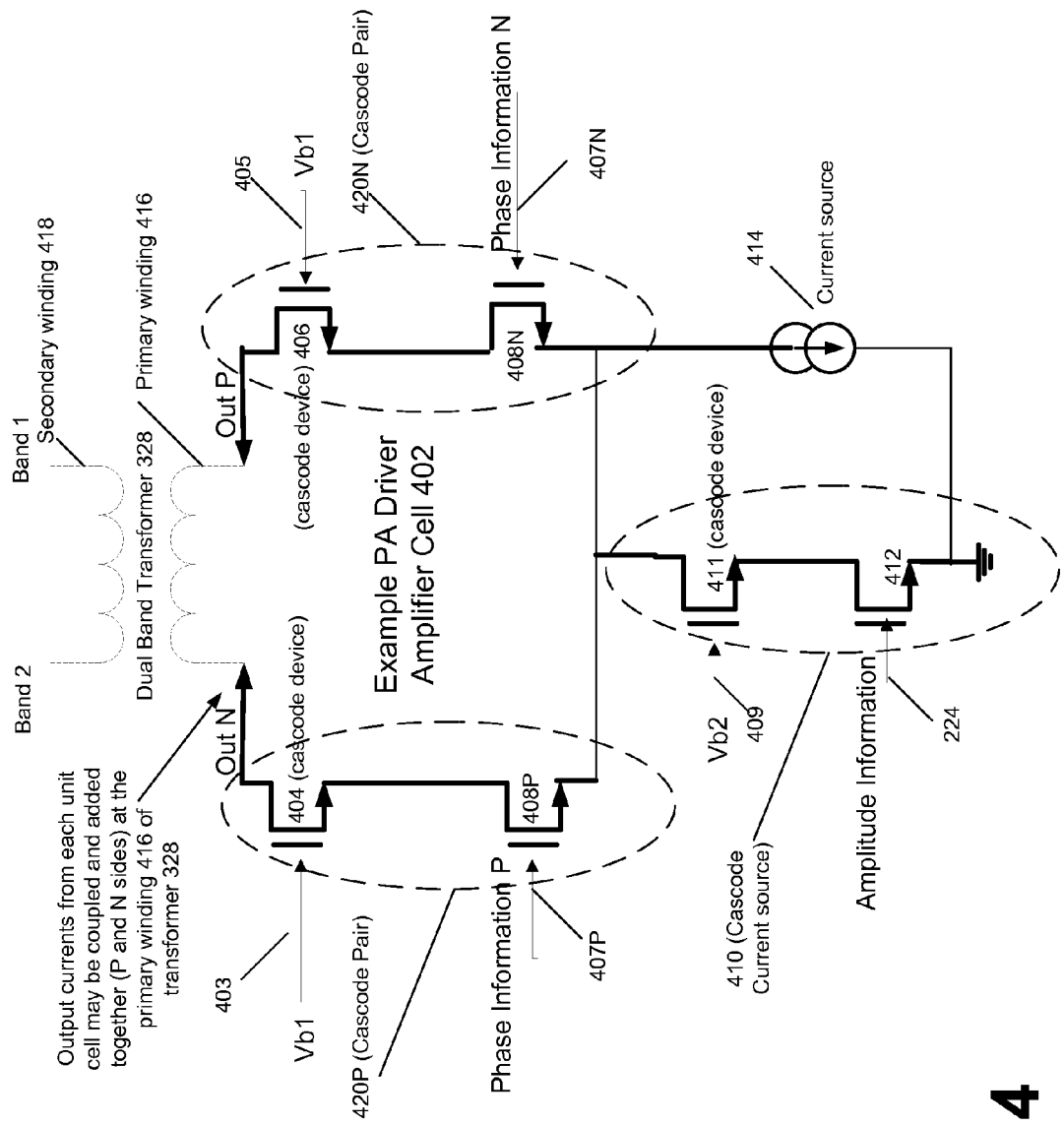
FIG. 4 is a diagram of a PA driver amplifier cell according to an example embodiment.

FIG. 4 is a diagram of a PA driver amplifier cell according to an example embodiment. Example amplifier cell 402 may include a cascode pair 420P of transistors coupled in series to a negative output (Out N) from amplifier cell 402. Cascode pair 420P may include a transistor 404 (e.g., a cascode transistor or cascode device) coupled to a negative output (Out N) of amplifier cell 402, and a transistor 408P coupled in series to the cascode transistor 404. Likewise, example amplifier cell 402 may include a cascode pair 420N of transistors coupled in series to a positive output (Out P) of amplifier cell 402. Cascode pair 420N may include a transistor 406 (e.g., a cascode transistor or cascode device) coupled to a negative output (Out N) of amplifier cell 402, and a transistor 408N coupled in series to the cascode transistor 406. In another example embodiment, the polarities of the differential outputs (Out P, Out N), may be switched.

A bias voltage (Vb1) may be input via lines 403 and 405 to gates of cascode transistors 404 and 406, respectively, to enable or select amplifier cell 402. A positive (e.g., differential) phase (or frequency) modulated signal may be input via line 407P to the gate of transistor 408P. A negative phase (or frequency) modulated signal may be input via line 407N to the gate of transistor 408N.

A current source 410 may be coupled to the cascode pairs 420P and 420N. Current source 410 may include a cascode pair of transistors, including a cascode transistor 411 coupled to the cascode pairs 420P and 420N, and a transistor 412 coupled in series between transistor 411 and ground. A bias voltage (Vb2) may be input via line 409 to the gate of cascode transistor 411 to enable or select amplifier cell 402. An amplitude modulated signal may be input via line 224 to the gate of transistor 412. In an alternative embodiment, a current source 414 may be coupled in parallel to cascode current source 410.

Thus, bias voltages (Vb1, Vb2) may be applied to cascode transistors 404, 406 and 411 to enable or select amplifier cell 402. In an example embodiment, the bias voltages (Vb1, Vb2) may be provided by a power control circuit 330 (FIG. 3), for example, based on a digital power control signal. Cascode transistors 404, 406 and 411 may, for example, increase linearity of the operation of amplifier cell 402, and may provide improved isolation from input to output, decrease signal leakage to the output when the amplifier cell 402 is not selected (or not operating) and enhance the voltage tolerance of the devices, for example. Amplifier cell 402 may combine or mix the amplitude modulated signal and the phase (or frequency) modulated signal, if the amplifier cell is selected or enabled.

According to an example embodiment, the differential outputs from amplifier cell 402, shown as Out P and Out N, may be coupled to a primary winding 416 of a dual band transformer 328. According to an example embodiment, a secondary winding 418 of transformer 328 may have a plurality of single-ended outputs, with each output coupled to drive a different PA, e.g., on a different frequency band, for example. The N and P outputs of each amplifier cells (320, 322, 324, . . . ) may be coupled together to the N and P outputs of the other amplifier cells, such that the current and/or power output by each amplifier cell may be added to the current or power output by other selected amplifier cells, for example. This may allow for a variable current or power to be provided by PA driver 216, e.g., based upon a power control signal, for example. Thus, in an example embodiment, the output current or power from PA driver 216 may scale or vary based on a number of amplifier cells that are selected or enabled. Alternatively, a single balanced mixer, or other mixer, may be used to mix or combine the phase modulated signal and amplitude modulated signal at amplifier cell 402. Thus, in an alternative embodiment, amplifier cell 402 may include a single balanced active mixer to combine phase and amplitude.

Figure 5:
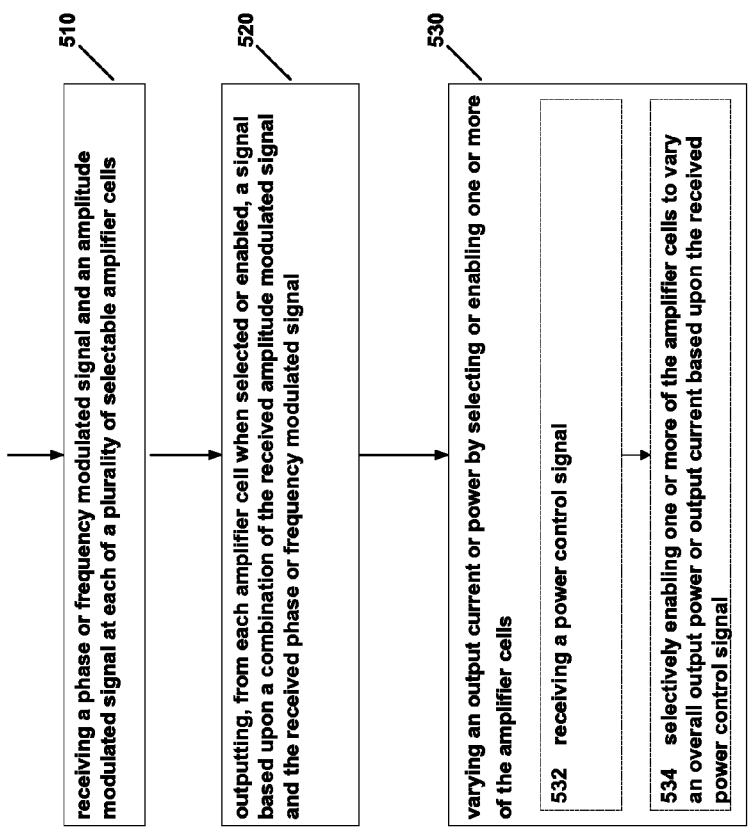
FIG. 5 is a flow chart illustrating operation of a driver circuit according to an example embodiment.

FIG. 5 is a flow chart illustrating operation of a driver circuit, such as a multi-band PA driver, according to an example embodiment. At 510, a phase or frequency modulated signal and an amplitude modulated signal may be received at each of a plurality of selectable amplifier cells.

At 520, a signal may be output from each amplifier cell when the amplifier cell is selected or enabled. The signal output by the amplifier cell may be based upon a combination of the received amplitude modulated signal and the received phase or frequency modulated signal.

At 530, the output current or output power (e.g., from the driver circuit) may be varied by selecting or enabling one or more of the amplifier cells. Operation 530 may include, for example, receiving a power control signal (532), and selectively enabling one or more of the amplifier cells to vary an overall output power or output current based upon the received power control signal (534).

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus comprising:
a plurality of selectable amplifier cells, each selectable amplifier cell adapted to receive a phase or frequency modulated signal and an amplitude modulated signal, each amplifier cell being adapted to output a signal based upon a combination of the received amplitude modulated signal and the received phase or frequency modulated signal if the amplifier cell is selected, wherein the apparatus is adapted to provide a variable output current based upon the selection of one or more of the amplifier cells.

2. The apparatus of claim 1, wherein each amplifier cell comprises:
a first cascode pair of transistors coupled to a positive output of the amplifier cell;
a second cascode pair of transistors coupled to a negative output of the amplifier cell; and
a cascode current source.

3. The apparatus of claim 2, wherein the first and second cascode pairs each includes:
a first transistor coupled to one of the outputs of the amplifier cell, and adapted to receive an enabling bias voltage when the amplifier cell is enabled or selected; and
a second transistor coupled in series with the first transistor, the first transistor adapted to receive as an input either a positive or negative differential phase or frequency modulated signal.

4. The apparatus of claim 2, wherein the cascode current source comprises:
a first transistor coupled to the first and second cascode pairs, the first transistor adapted to receive an enabling bias voltage when the amplifier cell is enabled; and
a second transistor coupled in series with the first transistor, the second transistor adapted to receive the amplitude modulated signal at an input.

5. The apparatus of claim 2, wherein each amplifier cell further comprises a current source coupled in parallel to the cascode current source.

6. The apparatus of claim 1, further comprising a multi-band transformer coupled to an output of each of the amplifier cells.

7. The apparatus of claim 1, wherein each of the amplifier cells comprises a single balanced active mixer to combine the received amplitude modulated signal and the received phase or frequency modulated signal.

8. The apparatus of claim 1, and further comprising a power control circuit adapted to receive a power control signal and select one or more of the plurality of selectable amplifier cells based on the power control signal.

9. The apparatus of claim 1, and further comprising a power control circuit adapted to receive a digital power control signal that includes a plurality of enable bits, wherein the power control circuit is adapted to select one or more of the plurality of selectable amplifier cells based on the plurality of enable bits.

10. The apparatus of claim 1, and further comprising a power control circuit adapted to receive a digital power control signal, the power control circuit also adapted to output one or more bias voltages, based on the digital power control signal, to select one or more of the selectable amplifier cells.

11. The apparatus of claim 1, wherein each amplifier cell includes one or more cascode transistors, the apparatus further comprising a power control circuit adapted to receive a digital power control signal that includes one or more enable bits, the power control circuit also adapted to output, based on the digital power control signal, one or more bias voltages to enable the one or more cascode transistors for one or more of the selectable amplifier cells.

12. The apparatus of claim 1, wherein each amplifier cell outputs approximately the same output current.

13. The apparatus of claim 1, wherein a plurality of the amplifier cells are different sizes and output different output currents.

14. The apparatus of claim 1, wherein the plurality of amplifier cells comprise:
a first amplifier cell that provides a first output current;
a second amplifier cell that provides a second output current that is approximately two times the first output current; and
a third amplifier cell that provides a third output current that is approximately four times the first output current.

15. The apparatus of claim 1, wherein the plurality of amplifier cells comprise:
a first amplifier cell, having one or more transistors with a first transistor size, and wherein the first amplifier cell provides a first output current;
a second amplifier cell, having one or more transistors with a second transistor size that is approximately two times the first transistor size, and wherein the second amplifier cell provides a second output current that is approximately two times the first output current.

16. The apparatus of claim 1, wherein a first amplifier cell provides X1 output current, and wherein a Kth amplifier cell provides KX1 output current.

17. The apparatus of claim 1, wherein the plurality of amplifier cells comprise:
a first amplifier cell that includes one unit cell and provides a first output current;
a second amplifier cell that includes two unit cells and provides a second output current that is approximately two times the first output current; and
a third amplifier cell that includes four unit cells and provides a third output current that is approximately four times the first output current.

18. The apparatus of claim 1, wherein outputs of each of the selectable amplifier cells are coupled together such that a current output from each of the amplifier cells are added together to provide a variable total output current for the plurality of selectable amplifier cells, wherein the total output current is variable based on a selection of one or more of the plurality of amplifier cells.

19. The apparatus of claim 1, and further comprising a multi-band transformer coupled to an output of each of the amplifier cells, the multi-band transformer outputting either a first signal associated with a first frequency band onto a first output of the transformer or a second signal associated with a second frequency band onto a second output of the transformer.

20. The apparatus of claim 1, and further comprising a multi-band transformer that includes a primary transformer winding that receives, as an input, a differential signal output from the plurality of amplifier cells, the multi-band transformer also including a secondary winding that is connected to one or more single-ended outputs.

21. An apparatus comprising:
a plurality of selectable amplifier cells, each selectable amplifier cell adapted to receive a phase or frequency modulated signal and an amplitude modulated signal, each amplifier cell being adapted to output a signal based upon a combination of the received amplitude modulated signal and the received phase or frequency modulated signal if the amplifier cell is selected, wherein the apparatus is adapted to provide a variable output current based upon the selection of one or more of the amplifier cells;

a power control circuit adapted to receive a digital power control signal that includes a plurality of enable bits, wherein the power control circuit is adapted to select one or more of the plurality of selectable amplifier cells based on the plurality of enable bits; and wherein the plurality of amplifier cells include at least:

a first amplifier cell, having one or more transistors with a first transistor size, and wherein the first amplifier cell provides a first output current;

a second amplifier cell, having one or more transistors with a second transistor size that is larger the first transistor size, and wherein the second amplifier cell provides a second output current that is greater than the first output current.

22. The apparatus of claim 21 wherein the second amplifier cell comprises a second amplifier cell, having one or more transistors with a second transistor size that is approximately two times the first transistor size, and wherein the second amplifier cell provides a second output current that is approximately two times the first output current.

23. The apparatus of claim 21, wherein the first amplifier cell comprises a first amplifier cell that includes one unit cell and provides a first output current, and wherein the second amplifier cell comprises a second amplifier cell that includes two unit cells and provides a second output current that is approximately two times the first output current.

24. A method comprising:

selecting one or more of a plurality of selectable amplifier cells;

receiving, at each of the selectable amplifier cells, a phase or frequency modulated signal and an amplitude modulated signal;

outputting, by each of the selectable amplifier cells, a signal based upon a combination of the received amplitude modulated signal and the received phase or frequency modulated signal if the amplifier cell is selected; and providing a variable output current based upon the selecting of one or more of the amplifier cells.

25. The method of claim 24 wherein the outputting comprises outputting, from a first amplifier cell, a first output current, and outputting, from a second amplifier cell, a second output current that is greater than the first output current.

26. The method of claim 24 wherein the outputting comprises outputting, from a first amplifier cell, a first output current, and outputting, from a second amplifier cell, a second output current that is approximately two times the first output current.

* * * * *